United States Patent
Tam

(10) Patent No.: US 7,236,011 B2
(45) Date of Patent: Jun. 26, 2007

(54) HIGH-SPEED DIFFERENTIAL LOGIC BUFFER

(75) Inventor: Kimo Y. F. Tam, Lincoln, MA (US)

(73) Assignee: Analog Devices, Inc., Norwood, MA (US)

( * ) Notice: Subject to any disclaimer, the term of this patent is extended or adjusted under 35 U.S.C. 154(b) by 62 days.

(21) Appl. No.: 10/945,323

(22) Filed: Sep. 20, 2004

(65) Prior Publication Data

US 2006/0061391 A1    Mar. 23, 2006

(51) Int. Cl.
*H03K 19/094* (2006.01)
*H03K 19/0175* (2006.01)

(52) U.S. Cl. .................. 326/83; 327/110; 327/111; 330/253

(58) Field of Classification Search .................. 326/27, 326/83, 86, 115; 327/109, 110, 111; 330/253
See application file for complete search history.

(56) References Cited

U.S. PATENT DOCUMENTS

| 6,788,103 B1 | 9/2004 | Feldman et al. ............. 326/34 |
| 2004/0227573 A1* | 11/2004 | Soda ........................... 330/253 |

OTHER PUBLICATIONS

Lee, Thomas H. "High-Frequency Amplifier Design", *The Design of CMOS Radio-Frequency Integrated Circuits*, 2d Ed. 2004, Chapter 9, pp. 270-276, no month.
Bui, et al "Shunt-Peaking of MCML Gates Using Active Inductors", *Circuits and Systems*, 2004, NEWCAS 2004, The $2^{nd}$ Annual IEEE Northeast Workshop On Montreal, Canada Jun. 20-23, 2004, USA, IEEE, Jun. 20, 2004, pp. 361-364.
Jiang, et al "A New CMOS Class-AB Transmitter for 10 GBPS Serial Links", *Circuits and Systems*, 2004, MWSCAS '04, The 2004 $47^{th}$ Midwest Symposium on Hiroshima, Japan, Jul. 25-28, 2004, USA, IEEE, vol. 3, Jul. 25, 2004, pp. III319-III322.
Sackinger, et al "A 3GHz, 32db CMOS Limiting Amplifier for SONET OC-48 Receivers", *International Solid-State Circuits Conference*, 2000, ISSCC '00, San Francisco, USA, Feb. 7, 2000, pp. 158-159.

* cited by examiner

*Primary Examiner*—Daniel Chang
(74) *Attorney, Agent, or Firm*—Bromberg & Sunstein LLP

(57) ABSTRACT

A circuit for a high speed digital buffer has an active load circuit connected to an output of the digital buffer. The active load circuit loads the buffer output with an active inductance to reduce the RC time constant at the buffer output. The active load circuit may be based on two active devices connected to the buffer output so as to form a differential cascode circuit.

77 Claims, 5 Drawing Sheets

HIGH-SPEED DIFFERENTIAL LOGIC BUFFER

FIELD OF THE INVENTION

The invention generally relates to data switching circuits, and more specifically to an active load circuit for a high speed logic buffer.

BACKGROUND ART

Current mode logic (CML) circuits are often used to implement high speed serial digital communications applications. Such circuits typically use resistively-loaded differential switch arrangements which can provide high speed, low supply noise generation, and high supply noise immunity. However, CML circuits draw relatively high power and may have limited speed in a given process technology.

One specific example of a high speed digital circuit is a crosspoint switch, which can selectably connect data signals between multiple inputs and multiple outputs. FIG. 1 shows the functional block architecture of a typical crosspoint switch. The left edge of the figure shows inputs 0–39 and the bottom edge shows outputs 0–35. Any input can be connected to any number of outputs. Each of the smaller dashed line boxes along the left side of FIG. 1 represents a two-stage input buffer. The larger dashed line boxes in the center of the figure are arrays of point cells to connect a selected input to a selected output. The smaller dashed line boxes along the bottom side of the figure are two-stage multiplexers to selectably connect multiple data paths to a given output port via an output buffer stage. As shown in FIG. 1, each of the second stage input buffers and first stage output multiplexers may serve only a subset of the output and input ports respectively. In addition, at high data speeds above 1 Gb/sec, the crosspoint may be further timesliced using parallel paths into alternating data slices at half the data rate each.

FIG. 2 provides a slice of such a crosspoint switch showing a single path connecting one input port to one output port. The crosspoint switch can be conceptually divided into a high-speed data path (shown by thin lines in FIG. 2) and a lower-speed control plane (shown by thick lines in FIG. 2). The control plane is run by a digital clocking signal and determines which pieces of the data path should be enabled for a given connectivity and when the enabling signals should change. For the switch control plane, connectivity data to control the data path may be written into control latches or flip-flops.

In FIG. 2, the first stage buffer 21 provides a high impedance input (with reduced input capacitance) and converts signal levels, for example, from CMOS to current mode logic (CML). Driving four sets of input lines from each of the second stage input buffers 22 reduces the number of point cells 23 loading each input by a factor of four (only nine point cells 23 on each second stage buffer 22). Groups of multiple point cells are provided to first stage multiplexers 24 to allow the associated data streams to be directed to selected output ports. The capacitance load on each point cell 23 (which may be simply resistively loaded CML buffers) is reduced by collecting five first stage multiplexers 24 for each second stage multiplexer 25 such that each first stage multiplexer collects eight inputs. The second stage multiplexer 25 also acts as an output buffer and provides signal level conversion; for example, from CML to full swing CMOS.

Passive inductors have been used to increase the speed of these circuits by resonating out the effects of parasitic capacitances, an effect referred to as shunt peaking. The basic elements of a shunt peaked amplifier are shown in FIG. 3. This is a typical common source amplifier with a peaking inductance 304 placed in series with the drain load resistance 303. The bandwidth of such a circuit is a function of the values of the output capacitance 302, load resistance 303, and peaking inductance 304. As frequency increases, the decreasing reactance of the output capacitance 302 is offset by a corresponding increase in the reactance of the added peaking inductance 304. Thus, the overall output impedance remains relatively flat over a much broader frequency range than in a circuit without the peaking inductance 304. But in integrated circuits applications, use of passive inductors is undesirably area-intensive, especially if low power is desired.

SUMMARY OF THE INVENTION

Embodiments of the present invention are directed to an active load circuit connected to an output of a high speed digital buffer, and to methods of operating such a circuit. The active load circuit loads the buffer output with an active inductance stage having a complex output impedance so as to decrease the rise and fall times at the buffer output. The high speed digital buffer may be, for example, a current mode logic circuit. The digital buffer may be, for example, a clock signal buffer or a data signal buffer.

In further specific embodiments, the digital buffer includes a differential switch pair circuit having a pair of differential inputs and a pair of differential outputs. In such an embodiment, the active load circuit may further include two active devices connected to the differential outputs so as to form a differential load circuit. For each active device, a gate impedance setting resistance may be connected between a device voltage source and a device control terminal. This resistor sets the high-frequency output impedance of the load.

The active devices may be medium voltage threshold devices, and each active device may include a back gate which is isolated and biased to a potential near a device supply voltage (e.g. a threshold voltage below the supply), for example, by a back gate supply diode.

Embodiments may include a trickle current resistance (or active NMOS or PMOS device) connecting the differential outputs to a device supply voltage to allow a trickle flow of current. The trickle current may also be set by separate current sources connected to each of the differential outputs. For each differential input, an input load resistance may connect the input to a device supply voltage. An auxiliary drain current resistance may provide a load current path for a preceding circuit stage.

Embodiments of the present invention also include a buffer containing any of the active load circuits above. Embodiments also include a crosspoint switch containing any of the active load circuits above.

Embodiments of the present invention also include a circuit for high speed digital data. A first active load device has an input terminal coupled to an output of a first digital buffer, and loads the buffer output with an active transinductance stage having a complex output impedance. The first active load device also includes an output terminal coupled to a device supply voltage. A second active load device also has an input terminal coupled to an output of a second digital buffer, and loads the buffer output with an active transinductance stage having a complex output impedance. The second active load device further includes a control terminal circuit which controls gain of the second active device. The second digital buffer includes an input which is coupled to the output of the first digital buffer. And the output terminal of the first active load device is coupled to the control terminal circuit of the second active load device.

In further such embodiments, the digital buffers are current mode logic circuits. Each digital buffer may include a differential switch pair circuit having a pair of differential inputs and a pair of differential outputs. For each differential output of each active device, an active device may be coupled so as to form a differential load circuit. There may also be a gate impedance setting resistance coupled between a device voltage source and a device control terminal.

In various embodiments, the active devices may be medium threshold voltage devices or low threshold devices. Each active device may include a back gate which is isolated and biased to a potential near a device supply voltage, and a back gate supply diode may be coupled to the device supply voltage provides the potential for each back gate.

Embodiments may also include a trickle current arrangement for each buffer, coupling the differential outputs to each other to allow a trickle flow of current. Or, for each differential output, a trickle current arrangement may be coupled to a device supply voltage to allow a trickle flow of current.

Embodiments may also include for each differential output, a series damping resistance coupling the output to the associated active load device. For each active load device, an auxiliary drain current resistance may provide a load current path for a preceding circuit stage. The digital buffers may be clock signal buffers or data signal buffers.

Embodiments of the present invention also include a crosspoint switch containing an active load circuit according to any of the above.

DETAILED DESCRIPTION OF SPECIFIC EMBODIMENTS

Various embodiments of the present invention are directed to techniques for using an active inductance stage load circuit to reduce the rise and fall times at the output terminals of a high speed digital buffer. This allows for significant improvement in stage bandwidth, which can be used to run circuits faster at a given current level or to maintain speed at a lower current level (thereby reducing power consumption). This facilitates implementation of high-speed digital circuits such as crosspoint switches. Embodiments of the present invention allow approximately a doubling of speed at a given power, or halving of power at a given speed, with low area penalty. Because some embodiments can be implemented with only resistors and transistors, they are better suited for implementation in integrated circuits than the older passive inductor approach.

Figure 1:
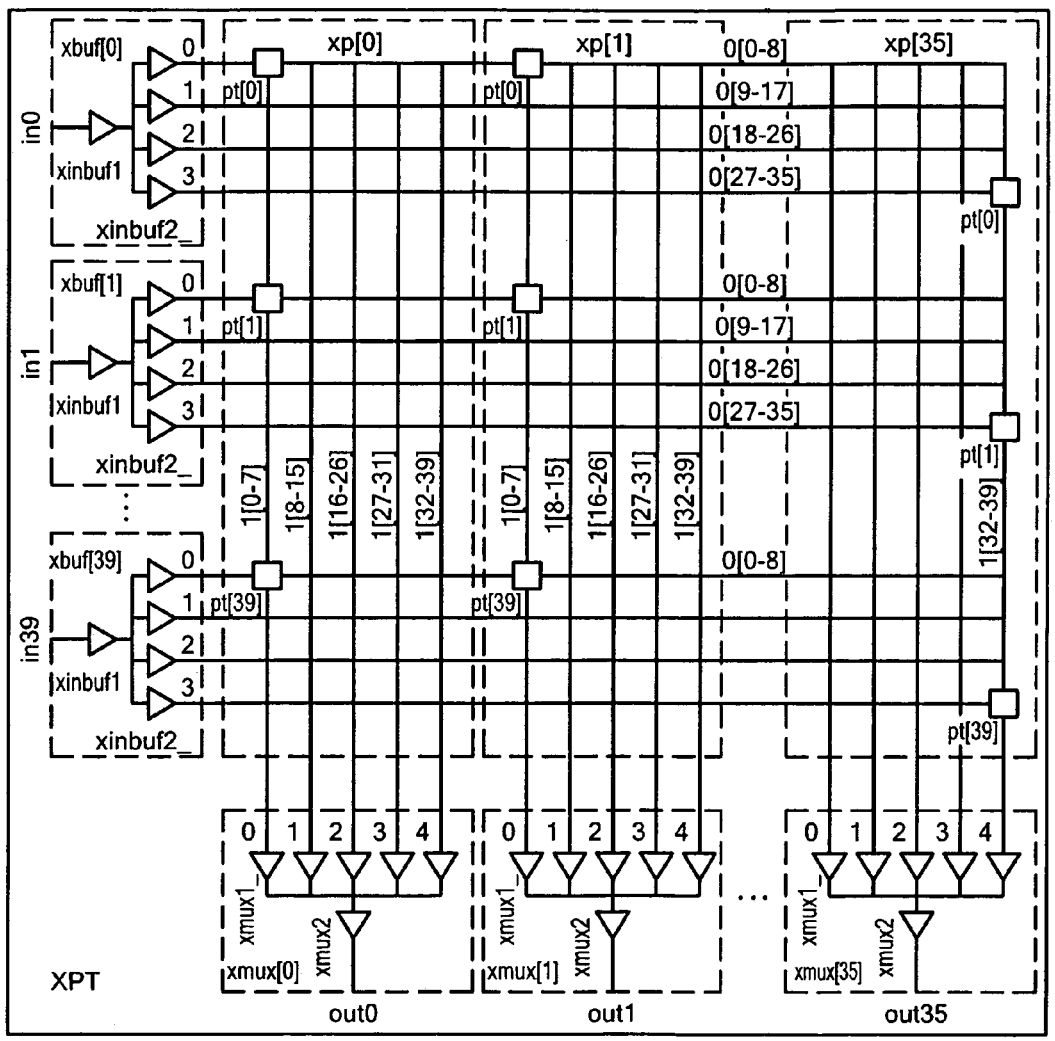
FIG. 1 shows the functional block architecture of a typical crosspoint switch.
Figure 2:
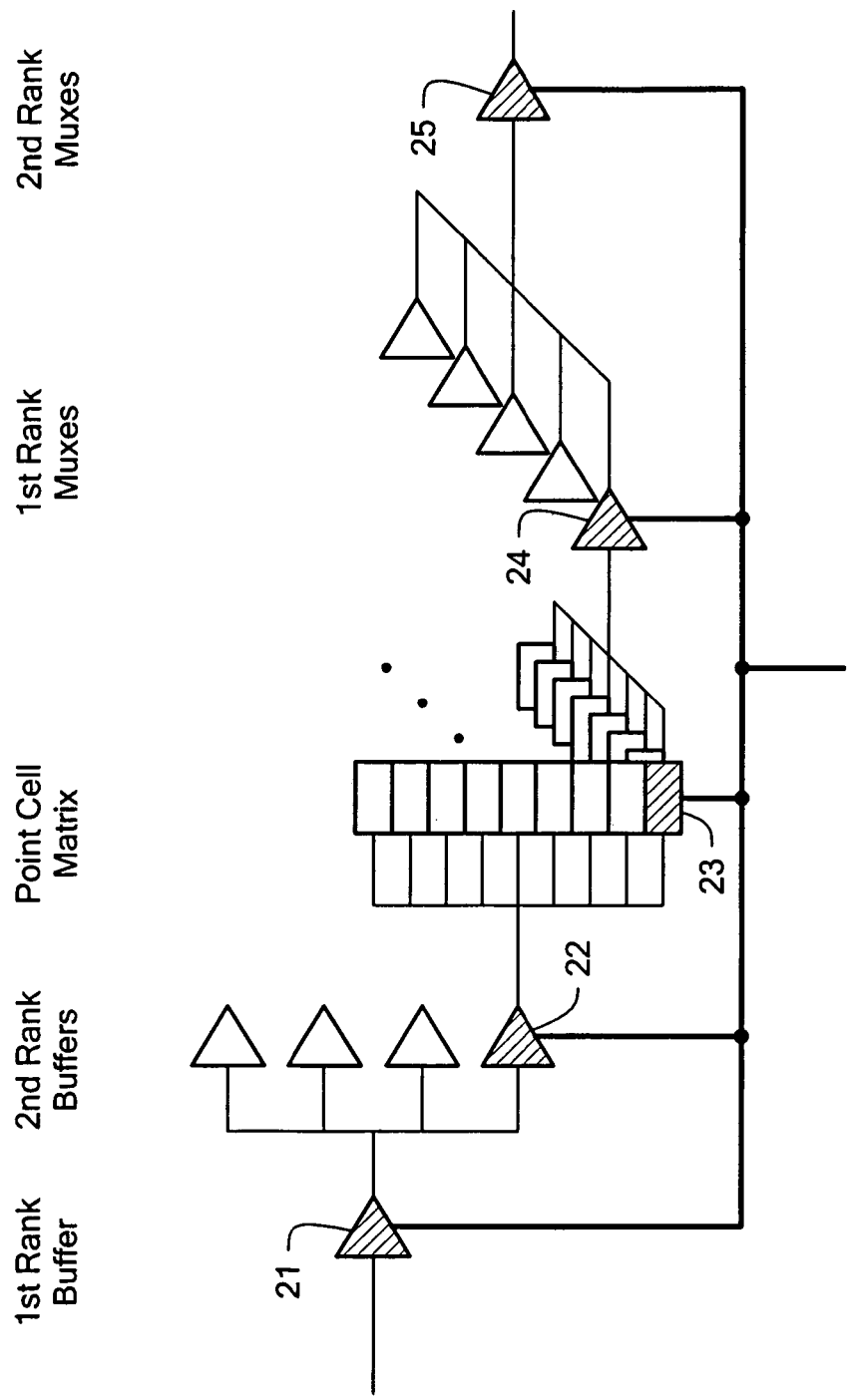
FIG. 2 provides a slice of a crosspoint switch according to FIG. 1 showing a single path connecting one input port to one output port.
Figure 3:
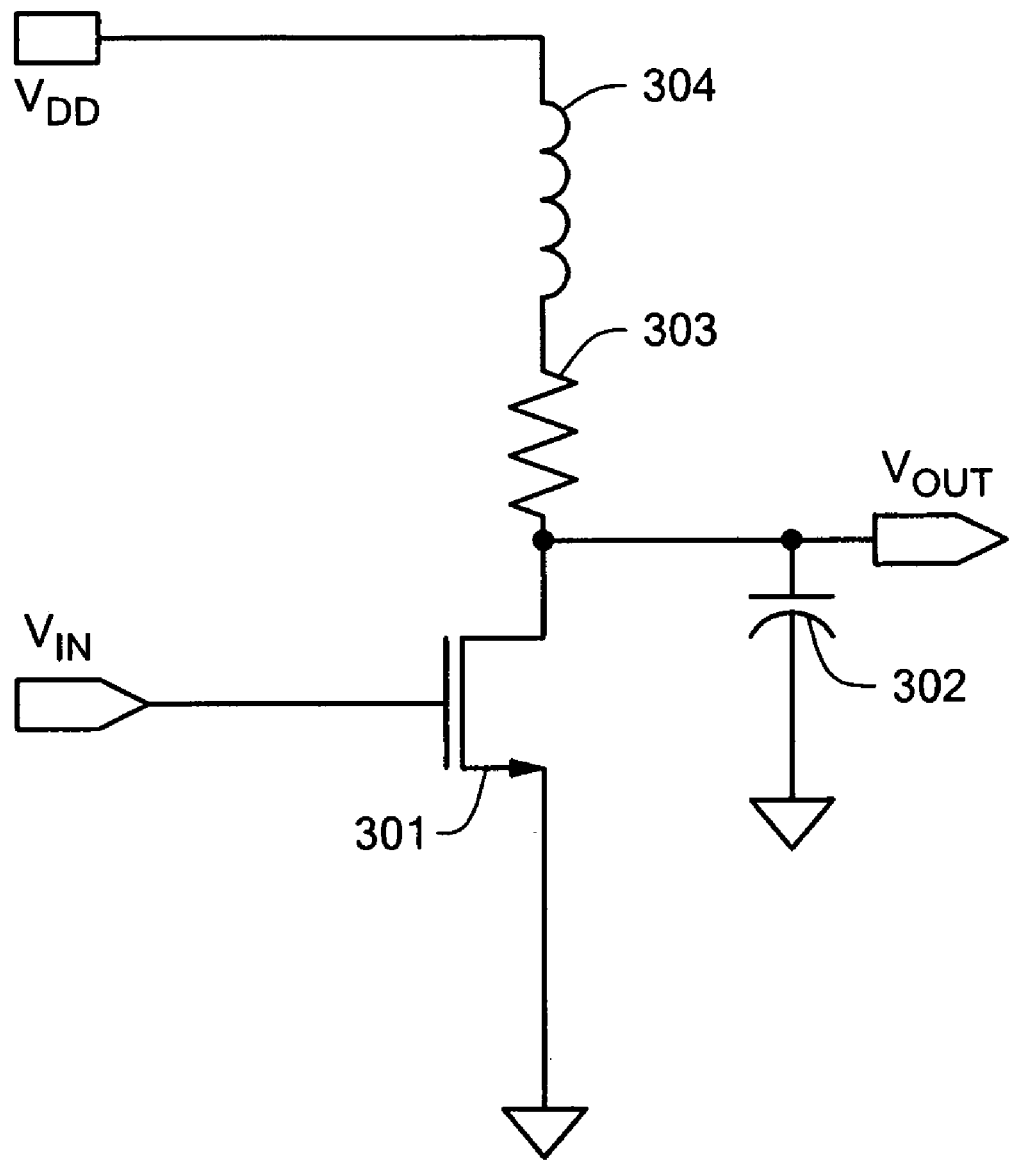
FIG. 3 shows a passive shunt peaked amplifier circuit according to the prior art.
Figure 4:
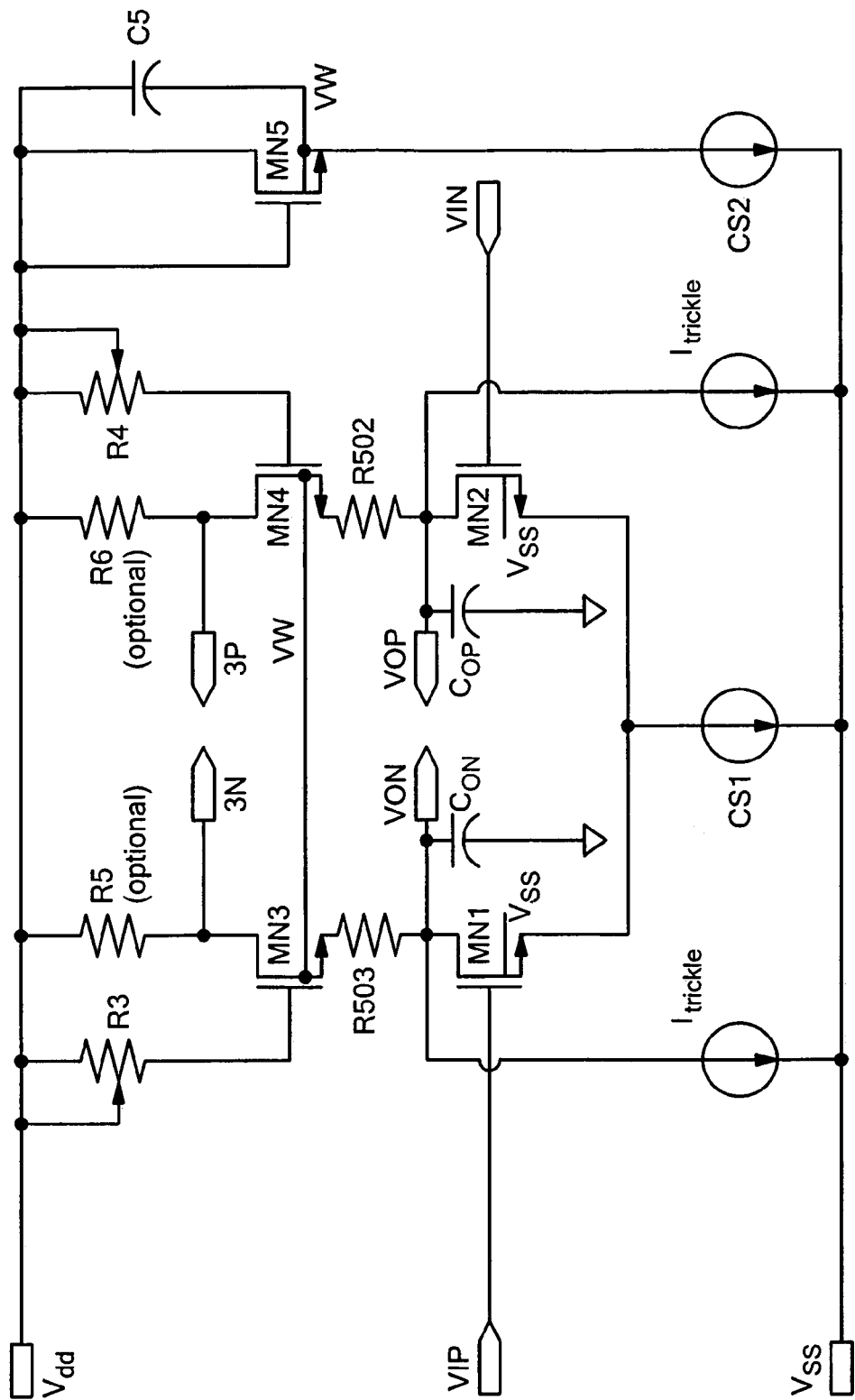
FIG. 4 shows an active inductance stage load circuit for a high-speed buffer according to one embodiment of the present invention.

FIG. 4 shows the circuit structure for an active load buffer according to one embodiment of the present invention. One specific application of such a circuit is as a clock buffer to drive a differential clock signal into multiple differential current mode latches representing a relatively high load. Input signals VIP and VIN are applied to differential common source amplifier devices MN1 and MN2, which are supplied current by current source CS1. Supplying the input signals VIP and VIN at relatively low common-mode voltage levels allows embodiments of the present invention to use an active inductance stage for the drain load circuits rather than providing a simple resistor load to the drains of MN1 and MN2, or a resistor and passive inductor combination as in a shunt peaked circuit. Thus, the MN3/R3/R5 combination is connected in cascode to the drain of MN1, and similarly the MN4/R4/R6 combination is connected in cascode to the drain of MN2.

By including gate current setting resistors R3 and R4 in series with the gates of the load devices MN3 and MN4, the impedance looking into their sources can be made to look inductive with a value:

$$L_{eff} = \frac{R_G}{\omega_T} = \frac{R_G C_{gs}}{g_m}.$$

Although the source currents of the load devices MN3 and MN4 may vary widely, their effective transconductance can be approximated as the value near balance (i.e. with each carrying half the tail current). For example, given a set of typical circuit parameters: $C_{gs}$=15 fF, $R_G$=4 KΩ, $g_m$=~1.3 mS at balance, an effective inductance $L_{eff}$=45 nH can be achieved in a relatively small area (less than 1/10 the area of a passive integrated inductor).

For a given load resistance and output capacitance, the bandwidth of the load impedance can be improved by adding such an active pseudo-inductance in series with the output load resistance. Up to about 1.8× improvement in 3 dB bandwidth over the baseline value ($\omega_{RC}=\tau_{RC}=1/RC$) can be achieved by choosing the peaking factor of the load devices MN3 and MN4 to be in a range: α=~0.6–0.9 (where $\tau_{LR}=L_{eff}/R$ and $\alpha \equiv \tau_{LR}/\tau_{RC} = L_{eff}/CR^2$). This bandwidth improvement can allow a circuit to operate faster at a given current level, or to maintain speed at a lower current level. This contrasts with a hypothetical passive inductor which would need to scale as the square of the increase in load resistance that would accompany a lower current level. The parameter α also influences damping factor, with a higher α resulting in more peaking. For the active load circuit, $R=1/g_m$, so $\alpha=(g_m R_G)(C_{gs}/C)$. For example, in the specific case of a clock buffer, the total loading (including self-loading) at the OP/ON node pair may result in α=~1.

If the differential output amplifier pair MN1/MN2 fully switches, there could be significant inter-symbol interference (ISI) at the output nodes VON and VOP because the active load device that is turning off (MN3 or MN4) may have a long transient tail due to low bias current and high capacitive loading. But in some specific cases such as a clock buffer with a fixed input pattern, this may not be a significant issue except for the first few edges coming out of disable mode. If the buffer circuit has to drive a large capacitive load, the added source capacitance of the active load should have a minimal impact on the total capacitance on the output nodes.

The active loads devices MN3 and MN4 may be realized using medium-threshold or low-threshold (near zero $V_T$) NMOS transistors rather than normal threshold voltage devices so that the output common-mode level is high enough to keep the tail current sources of the clocked circuits in saturation across PVT. As a result of high body effect coefficient, even medium VT devices may have excessively high threshold voltages (VT=540 mV at VSB=1.3V vs. ~280 mV @ VSB=0 V), so they may also have their back gates isolated and biased to a potential near $V_{DD}$. This can be accomplished, for instance, via back gate supply diode MN5, which sets the local P-well potential ($V_W$) such that the sources of MN3 and MN4 are near zero-biased at the low end of their swing ranges (i.e. $V_{OL}$). The use of an MVT NMOS device to form MN5 keeps $V_W$ near the source potential of the active loads that it replicates.

One disadvantage of using MVT devices for the active load circuit is the larger minimum gate length, for example, 0.30 μm as opposed to 0.18 μm for nominal VT NMOS devices. This difference may result in a significant capacitance penalty because the device widths should also be doubled for a desired current level and gate overdrive level. By appropriately scaling current levels and device sizes, the swings developed across NMOS active loads could be set to match those needed to fully switch (with some margin) the input devices of the following stages, independent of process and temperature. The length disparity between the MVT NMOS loads of a source stage and that of the NMOS differential pairs at the inputs to a driven stage may impair this tracking over process, although the effective mobility and oxide capacitance of the two device types may be expected to track well.

Figure 5:
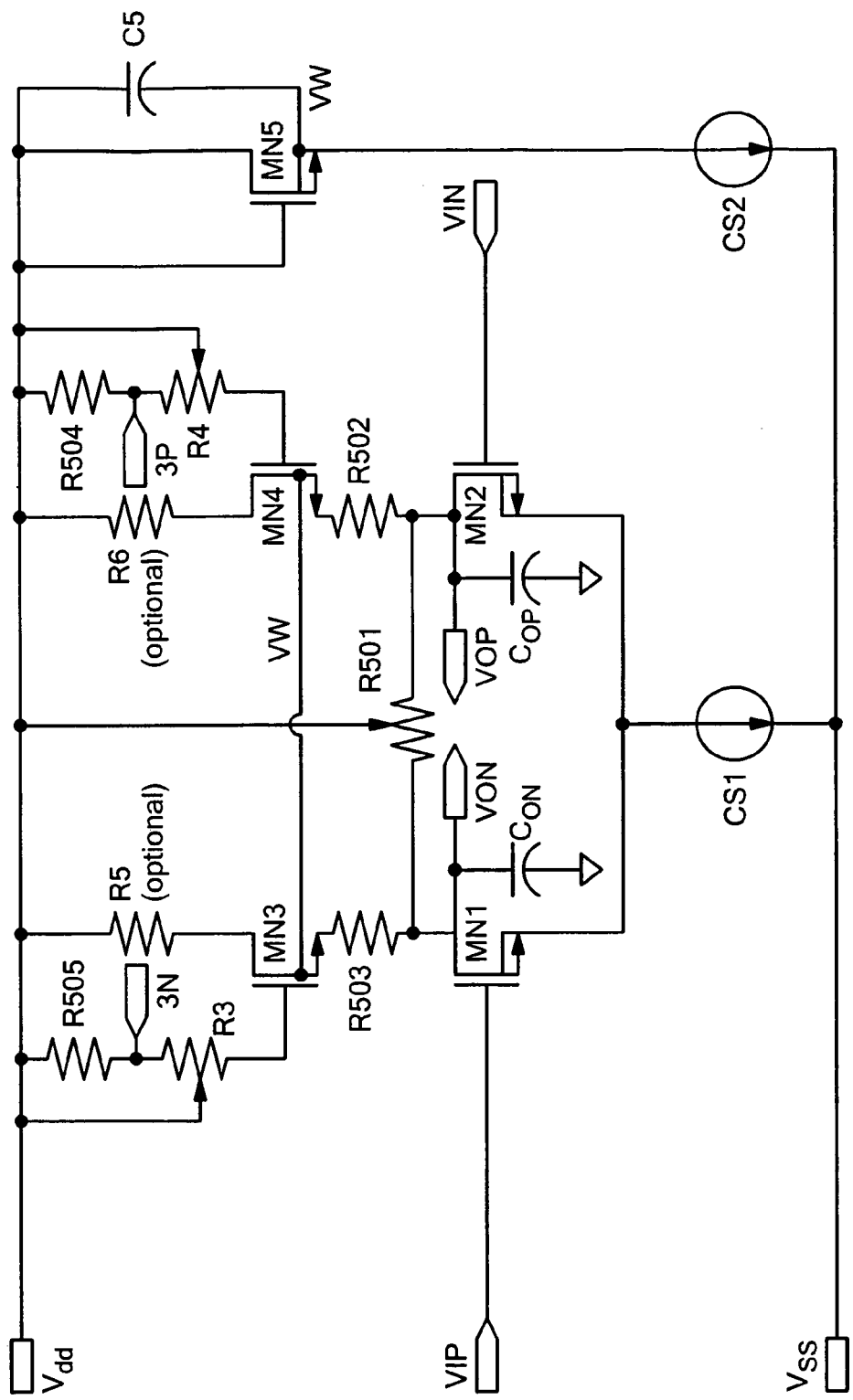
FIG. 5 shows an alternative embodiment of the present invention.

FIG. 5 shows another embodiment of the present invention in which the specific application is as an output data buffer for a crosspoint switch instead of as a clock buffer. The input load presented by a single output driver segment into multiple fanout outputs may be significant, for example, $C_{tot}$~180 fF. If pure resistive loads are used, the high-speed data path can still be tapered to a multiple output fanout and maintain significant data speed and rise time performance (e.g., 3.2 Gb/s speed and ~100 ps output rise times). But using active load circuits instead will lower power dissipation at the same speed in an output data buffer.

Embodiments such as the one FIG. 5 as used in an application such as an output data buffer may differ in various ways from those in other applications such as in a clock buffer as depicted in FIG. 4. For instance, the embodiment in FIG. 5 includes trickle current resistance R501 to trickle a small current into the otherwise off side of the differential active load to minimize ISI due to a slow transient tail on that node. Series damping R502 and R503 between the active loads and the outputs (VOP and VON) give a degree of freedom (in addition to the cascode gate resistors R3/R4 and the widths of MN3/4) that provide for the swing and overshoot at output nodes VOP and VON to be adjusted.

FIG. 5 also shows that the drain currents of the cascode active devices in a preceding stage are reused and fed forward to nodes 3P and 3N, where they flow through auxiliary drain current resistances R505 and R504 respectively to $V_{DD}$. This can be achieved by connecting nodes 3P and 3N in FIG. 4 to nodes 3P and 3N, respectively, in FIG. 5, while also connecting nodes OP and ON in FIG. 4 to nodes IP and IN, respectively, in FIG. 5. Thus an extra 50% of swing at these nodes is delivered to the output nodes VOP and VON through MN3/MN4, which act as source followers for this auxiliary signal path. This extra path also gives a degree of freedom to shape the waveforms at the output nodes VOP and VON without the need for physically large, low resistance resistors in series with the sources of MN3/MN4. This current re-use also improves the rise times at nodes 3P/3N by about 5%–10% over the case where the drains of the preceding stage active devices are simply returned to $V_{DD}$.

Although various exemplary embodiments of the invention have been disclosed, it should be apparent to those skilled in the art that various changes and modifications can be made which will achieve some of the advantages of the invention without departing from the true scope of the invention.

What is claimed is:

1. A circuit for a high speed digital buffer, the circuit comprising:
    an active load circuit connected to an output of the high speed digital buffer, the buffer including a differential switch pair circuit having a pair of differential inputs and a pair of differential outputs, each differential output including a medium threshold voltage active device including an isolated back gate biased to a potential near a device supply voltage, the active devices being coupled so as to form a differential load circuit;
    wherein the active load circuit loads the buffer output with an active transinductance stage having:
    i. a complex output impedance, and
    ii. current flow provided by a current source flowing through the buffer output.

2. A circuit according to claim 1, wherein a back gate supply diode coupled to the device supply voltage provides the potential for each back gate.

3. A circuit according to claim 1, wherein the digital buffer is a current mode logic circuit.

4. A circuit according to claim 1, hither comprising:
    for each active device, a gate impedance setting resistance coupled between a device voltage source and a device control terminal.

5. A circuit according to claim 1, further comprising:
    a trickle current arrangement coupling he differential outputs to each other to allow a trickle flow of current.

6. A circuit according to claim 1, further comprising:
    for each differential output, a trickle current arrangement coupled to a device supply voltage to allow a trickle flow of current.

7. A circuit according to claim 1, further comprising:
    for each differential output, a series damping resistance coupling the output to the associated active load circuit.

8. A circuit for a high speed digital buffer, the circuit comprising:
    an active load circuit connected to an output of the high speed digital buffer, the buffer including a differential switch pair circuit having a pair of differential inputs and a pair of differential outputs, each differential output including a low threshold voltage active device including an isolated back gate biased to a potential near a device supply voltage, the active devices being coupled so as to form differential load circuit;
    wherein the active load circuit loads the buffer output with an active transinductance stage having:
    i. a complex output impedance, and
    ii. current flow provided by a current source flowing through the buffer output.

9. A circuit according to claim 8, wherein a back gate supply diode coupled to the device supply voltage provides the potential for each back gate.

10. A circuit according to claim 8, further comprising:
a trickle current arrangement coupling the differential outputs to each other to allow a trickle flow of current.

11. A circuit according to claim 8, further comprising:
for each differential output, a trickle current arrangement coupled to a device supply voltage to allow a trickle flow of current.

12. A circuit according to claim 8, further comprising:
for each differential output, a series damping resistance coupling the output to the associated active load circuit.

13. A circuit according to claim 8, wherein the digital buffer is a current mode logic circuit.

14. A circuit according to claim 8, further comprising:
for each active device, a gate impedance setting resistance coupled between a device voltage source and a device control terminal.

15. A circuit according to claim 8, further comprising:
a trickle current arrangement coupling the differential outputs to each other to allow a trickle flow of current.

16. A circuit according to claim 8, further comprising:
for each differential output, a trickle current arrangement coupled to it device supply voltage to allow a trickle flow of current.

17. A circuit according to claim 8, further comprising:
for each differential output, a series damping resistance coupling the output to the associated active load circuit.

18. A circuit for a high speed digital buffer, the circuit comprising:
an active load circuit connected to an output of the high speed digital buffer and loading the buffer output with an active transinductance stage having a complex output impedance, wherein current flow for the active transinductance stage is provided by a current source flowing through the buffer output; and
for each active load device, an auxiliary drain current resistance which provides a load current path for a preceding circuit stage.

19. A circuit according to claim 18, wherein the digital buffer is a current mode logic circuit.

20. A circuit according to claim 18, further comprising:
for each active device, a gate impedance setting resistance coupled between a device voltage source and a device control terminal.

21. A circuit according to claim 18, further comprising:
a trickle current arrangement coupling the differential outputs to each other to allow a trickle flow of current.

22. A circuit according to claim 18, further comprising:
for each differential output, a trickle current arrangement coupled to a device supply voltage to allow a trickle flow of current.

23. A circuit according to claim 18, further comprising:
for each differential output, a series damping resistance coupling the output to the associated active load circuit.

24. A method for loading a high speed digital buffer, the method comprising:
coupling an active load circuit to an output of the high speed digital buffer, the buffer including a differential switch pair circuit having a pair of differential inputs and a pair of differential outputs, each differential output including a medium threshold voltage active device coupled so as to form a differential load circuit; and
isolating and biasing a back gate of each active device to a potential near a device supply voltage;
wherein the active load circuit loads the buffer output with an active transinductance stage having:
i. a complex output impedance, and
ii. current flow provided by a current source flowing through the buffer output.

25. A method according to claim 24, further comprising:
coupling a back gate supply diode to a device supply voltage to provide the potential for each back gate.

26. A method according to claim 24, wherein the digital buffer is a current mode logic circuit.

27. A method according to claim 24, further comprising:
for each active device, coupling a gate impedance setting resistance between a device voltage source and a device control terminal.

28. A method according to claim 24, further comprising:
coupling a trickle current resistance between the differential outputs and a device supply voltage to allow a trickle flow of current.

29. A method according to claim 24, further comprising:
for each differential input, coupling an input load resistance between the input and a device supply voltage.

30. A method for loading a high speed digital buffer, the method comprising:
coupling an active load circuit to an output of the high speed digital buffer, the buffer including a differential switch pair circuit having a pair of differential inputs and a pair of differential outputs, each differential output including a low threshold voltage active device coupled so as to form a differential load circuit; and
isolating and biasing a back gale of each active device to a potential near a device supply voltage;
wherein the active load circuit loads the buffer output with an active transinductance stage having:
i. a complex output impedance, and
ii. current flow provided by a current source flowing through the buffer output.

31. A method according to claim 30, further comprising:
coupling a back gate supply diode to a device supply voltage to provide the potential for each back gate.

32. A method according to claim 30, further comprising:
coupling a trickle current resistance between the differential outputs and a device supply voltage to allow a trickle flow of current.

33. A method according to claim 30, further comprising:
for each differential input, coupling an input load resistance between the input and a device supply voltage.

34. A method according to claim 30, wherein the digital buffer is a current mode logic circuit.

35. A method according to claim 30, further comprising:
for each active device, coupling a gate impedance selling resistance between a device voltage source and a device control terminal.

36. A method according to claim 30, further comprising:
coupling a trickle current resistance between the differential outputs and a device supply voltage to allow a trickle flow of current.

37. A method according to claim 30, further comprising:
for each differential input, coupling an input load resistance between the input and a device supply voltage.

38. A method for loading a high speed digital buffer, the method comprising:
coupling an active load circuit to an output of the high speed digital buffer;
loading the buffer out put with an active transinductance stage having a complex output impedance, wherein current flow for the active transinductance stage is provided by a current source flowing through the buffer output; and providing an auxiliary drain current resistance to present a load current path for a preceding circuit stage.

39. A method according to claim 38, wherein the digital buffer is a current mode logic circuit.

40. A method according to claim 38, further comprising:
for each active device, coupling a gate impedance setting resistance between a device voltage source and a device control terminal.

41. A method according to claim 38, further comprising:
coupling a trickle current resistance between the differential outputs and a device supply voltage to allow a trickle flow of current.

42. A method according to claim 38, further comprising:
for each differential input, coupling an input load resistance between the input and a device supply voltage.

43. A circuit for high speed digital data, the circuit comprising:
a first active load device having an input terminal coupled to an output of a first digital buffer, the first active load device loading the buffer output with an active transinductance stage having a complex output impedance, the first active load device further including an output terminal coupled to a device supply voltage; and
a second active load device having an input terminal coupled to an output of a second digital buffer, the second active load device loading the buffer output with an active transinductance stage having a complex output impedance, the second active load device further including a control terminal circuit which controls gain of the second active device;
wherein the second digital buffer includes an input which is coupled to the output of the first digital buffer; and
wherein the output terminal of the first active load device is coupled to the control terminal circuit of the second active load device.

44. A circuit according to claim 43, wherein the digital buffers are current mode logic circuits.

45. A circuit according to claim 43, wherein each digital buffer includes a differential switch pair circuit having a pair of differential inputs and a pair of differential outputs.

46. A circuit according to claim 45, further comprising:
for each differential output of each active load device, an active device coupled so as to form a differential load circuit.

47. A circuit according to claim 46, further comprising:
for each active device, a gate impedance setting resistance coupled between a device voltage source and a device control terminal.

48. A circuit according to claim 43, wherein the active load devices are medium threshold voltage devices.

49. A circuit according to claim 48, wherein each active device includes a back gate which is isolated and biased to a potential near a device supply voltage.

50. A circuit according to claim 43, wherein a back gate supply diode coupled to the device supply voltage provides the potential for each back gate.

51. A circuit according to claim 43, wherein the active load devices arc low threshold voltage devices.

52. A circuit according to claim 51, wherein each active device includes a back gate which is isolated and biased to a potential near a device supply voltage.

53. A circuit according to claim 52, wherein a back gate supply diode coup ed to the device supply voltage provides the potential for each back gate.

54. A circuit according to claim 43, further comprising:
a trickle current arrangement for each buffer, coupling the differential outputs to each other to allow a trickle flow of current.

55. A circuit according to claim 43, further comprising:
for each differential output, a trickle current arrangement coupled to a device supply voltage to allow a trickle flow of current.

56. A circuit according to claim 43, further comprising:
for each differential output, a series damping resistance coupling the output to the associated active load device.

57. A circuit according to claim 43, further comprising:
for each active load device, an auxiliary drain current resistance which provides a load current path for a preceding circuit stage.

58. A circuit according to claim 43, wherein the digital buffers are clock signal buffers.

59. A circuit according to claim 43, wherein the digital buffers are data signal buffers.

60. A crosspoint switch containing an active load circuit, the crosspoint switch comprising:
a circuit for high speed digital data including:
a first active load device having an input terminal coupled to an output of a first digital buffer, the first active load device loading the buffer output with an active transinductance stage having a complex output impedance, the first active load device further including an output terminal coupled to a device supply voltage; and
a second active load device having an input terminal coupled to an output of a second digital buffer, the second active load device loading the buffer o output with an active transinductance stage having a complex output impedance, the second active load device further including a control terminal circuit which controls gain of the second active device;
wherein the second digital buffer includes an input which is coupled to the output of the first digital buffer; and
wherein the output terminal of the first active load device is coupled to the control terminal circuit of the second active load device.

61. A method for loading a high speed digital data circuit, the method comprising:
providing a first active load device including:
i. coupling an input terminal of the first active load device to an output of a first digital buffer so as to load the buffer output with an active transinductance stage having a complex output impedance, and
ii. coupling an output terminal of the first active load device to a device supply voltage; and
providing a second active load device including:
i. coupling an input terminal of the second active load device to an output of a second digital buffer so as to load the buffer output with an active transinductance stage having a complex output impedance, and
ii. providing a control terminal circuit which controls gain of the second active device;
coupling an input of the second digital buffer to the output of the first digital buffer; and coupling the output terminal of the first active load device to the control terminal circuit of the second active load device.

62. A method according to claim 61, wherein the digital buffers are current mode logic circuits.

63. A method according to claim 61, wherein each digital buffer includes a differential switch pair circuit having a pair of differential inputs and a pair of differential outputs.

64. A method according to claim 63, further comprising:
for each differential output of each active load device, coupling an active device so as to form a differential load circuit.

65. A method according to claim 64, further comprising:
for each active device, coupling a gate impedance setting resistance between a device voltage source and a device control terminal.

66. A method according to claim 64, wherein the active devices are medium threshold voltage devices.

67. A method according to claim 66, wherein each active device includes a back gate which is isolated and biased to a potential near a device supply voltage.

68. A method according to claim 67, wherein a back gate supply diode coupled to the device supply voltage provides the potential for each back gate.

69. A method according to claim 64, wherein the active devices are low threshold voltage devices.

70. A method according to claim 69, wherein each active device includes a back gate which is isolated and biased to a potential near a device supply voltage.

71. A method according to claim 70, wherein a back gate supply diode coupled to the device supply voltage provides the potential for each back gate.

72. A method according to claim 64, further comprising:
for each buffer, coupling the differential outputs to each other with a trickle current arrangement to allow a trickle flow of current.

73. A method according to claim 64, further comprising:
for each differential output of each buffer, coupling a trickle current arrangement between the output and a device supply voltage to allow a trickle flow of current.

74. A method according to claim 64, further comprising:
for each differential output of each buffer, coupling a series damping resistance to the associated active load device.

75. A method according to claim 61, further comprising:
for each active load device, providing a load current path for a preceding circuit stage with an auxiliary drain current resistance.

76. A method according to claim 61, wherein the digital buffers are clock signal buffers.

77. A method according to claim 61, wherein the digital buffers are data signal buffers.

* * * * *

UNITED STATES PATENT AND TRADEMARK OFFICE
CERTIFICATE OF CORRECTION

PATENT NO. : 7,236,011 B2  
APPLICATION NO. : 10/945323  
DATED : June 26, 2007  
INVENTOR(S) : Kimo Y. F. Tam Page 1 of 1

It is certified that error appears in the above-identified patent and that said Letters Patent is hereby corrected as shown below:

In Col. 6, line 41  
replace "he"  
with --the--.

In Col. 8, line 66  
replace "out put"  
with --output--.

In Col. 9, line 66  
replace "coup ed"  
with --coupled--.

In Col. 10, line 32  
delete "o".

Signed and Sealed this

Fourteenth Day of August, 2007

JON W. DUDAS  
*Director of the United States Patent and Trademark Office*